INVENTORS C. A. LEE
H. G. WHITE
BY [signature]
ATTORNEY

FABRICATION OF PN JUNCTION DEVICES

Filed March 25, 1960 2 Sheets-Sheet 2

INVENTORS C. A. LEE
H. G. WHITE
BY [signature]
ATTORNEY

United States Patent Office 3,082,127

Patented Mar. 19, 1963

3,082,127

FABRICATION OF PN JUNCTION DEVICES

Charles A. Lee, New Providence, and Harry G. White, Bernardsville, N.J., assignors to Bell Telephone Laboratories, Incorporated, New York, N.Y., a corporation of New York Filed Mar. 25, 1960, Ser. No. 17,622
3 Claims. (Cl. 148—1.5)

Figure 1A:
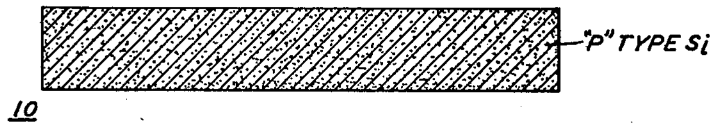
Figure 1B:
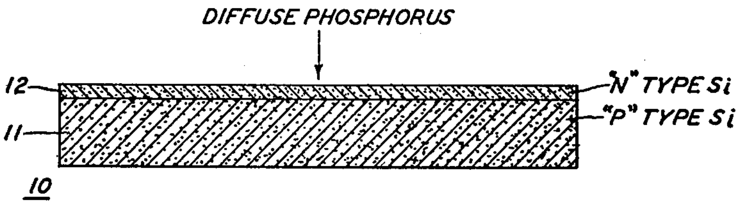

This invention relates to semiconductor signal translating devices and, more particularly, to a method for fabricating alloy P-type conductivity regions on N-type conductivity silicon.

It is desirable for a number of applications to fabricate silicon semiconductor PN junction devices by alloying an acceptor or P-type conductivity inducing material to N-type conductivity material. In many instances it is desirable also to accomplish such alloying over precise limits of area and volume in order to produce desired geometric arrangements. From this standpoint of alloying control, it has been found most advantageous to use aluminum as an acceptor material and this has become generally accepted for the fabrication of various germanium PN junction devices. Specifically, one such structure advantageously using an alloyed aluminum emitter is the diffused base germanium transistor disclosed in the copending application of G. C. Dacey, C. A. Lee, and W. Shockley, Serial No. 496,202, filed March 23, 1955, now Patent No. 3,028,655.

However, because of the lower solid solubility of aluminum in silicon it has been extremely difficult to achieve, in an alloyed aluminum emitter region of a silicon diffused base transistor, the impurity concentration needed for high injection efficiencies. Moreover, since no other acceptor impurities are known which permit the geometry control necessary for the emitter region of a diffused base transistor, there has been unavailable hitherto any technique for forming a good alloyed emitter for use in a silicon diffused base transistor.

Additionally, in the fabrication of silicon Esaki or tunnel diodes there is a great need for a technique for forming an alloy region of high impurity concentration and highly controllable geometry.

An object of the invention is the formation in silicon of a P-type alloy region in which the acceptor concentration is high and whose geometry can be readily controlled, whereby small area junctions can be achieved.

In accordance with this invention, a technique is provided for utilizing aluminum to produce P-type conductivity alloy regions of high acceptor concentrations in N-type conductivity silicon. In particular, the method of the invention includes the formation of a composite layer, of aluminum and a suitable boron compound reducible by the aluminum, of controlled geometry on the silicon substrate, and then alloying the composite aluminum-boron compound layer into the silicon, advantageously with a particular alloying cycle.

In one specific embodiment in accordance with this invention particularly suitable for making a tunnel diode, a wafer of N-type silicon is mounted in vacuum evaporation apparatus with a polished surface exposed to the evaporation source. First, a thin film of aluminum of prescribed geometry is deposited on the wafer surface, and over this a layer of boron oxide is similarly deposited. Then, an additional layer of aluminum is evaporated to cover the boron oxide. The semiconductor wafer is then heated at about 700 degrees centigrade for a short period, at least 30 seconds. The temperature then is increased abruptly to about 1000 degrees centigrade and dropped as abruptly to the resolidification temperature. Typically, the total time for the heat spike of this cycle, involving going from 700 to 1000 degrees centigrade and then back to the aluminum-silicon eutectic, is about ten seconds. This technique provides an alloy regrowth region in which the acceptor density is in excess of $10^{19}$ per cubic centimeter and which is therefore suitable for use either in a tunnel diode or as a high emission emitter region of a diffused base transistor.

Accordingly, a feature of this invention is the vacuum deposition of aluminum on silicon to define precisely the geometry of alloyed regions and, to deposit coincidentally with the aluminum, boron oxide to insure high acceptor densities. A specific feature of the invention is the use of an alloying temperature cycle which concludes with a rapid rise and fall in temperature.

Figure 1C:
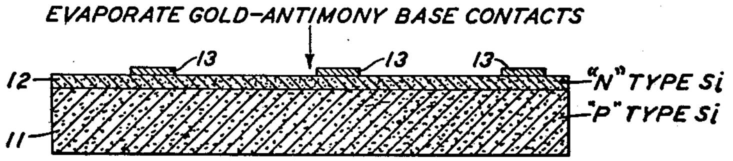
Figure 1D:
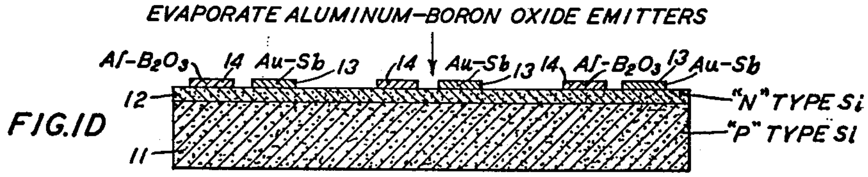
Figure 1E:
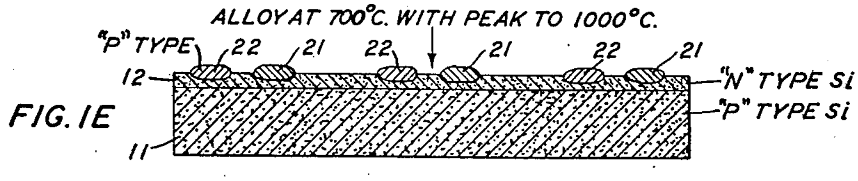
Figure 1F:
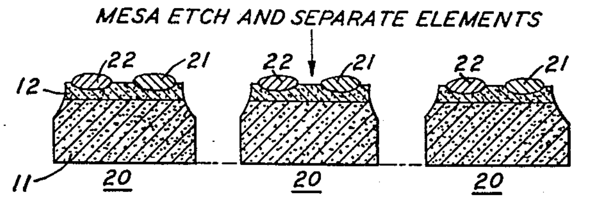
Figure 2:
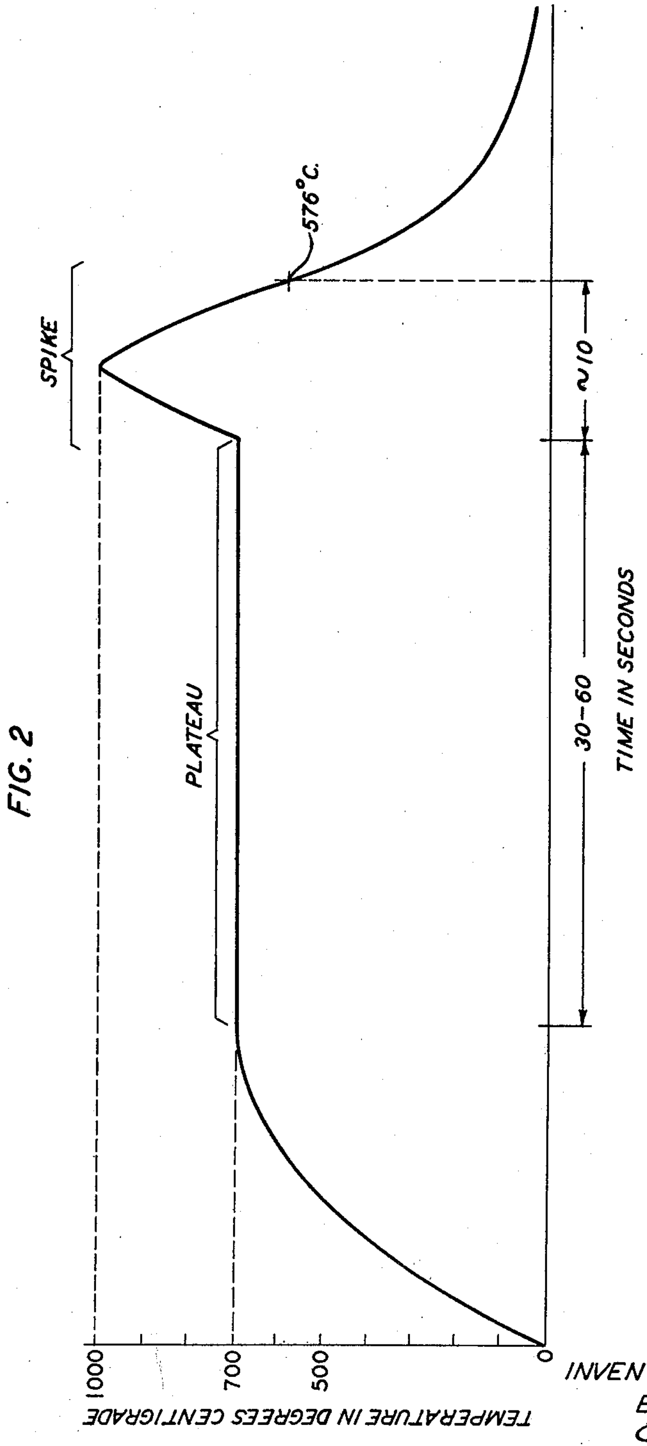

The invention and its other objects and features will be more clearly understood from the following detailed description taken in connection with the drawing in which:

FIGS. 1A through 1F show in schematic cross section the fabrication of a PNP diffused base silicon transistor from an original slice of P-type silicon semiconductor material; and FIG. 2 is a graph of the preferred heating cycle for this invention.

Referring to the drawing, an appreciation of the method of this invention may be had by describing its use in the fabrication of a diffused base silicon transistor. The starting material for the process is the slice 10, approximately 100 x 100 mils in area and ten mils thick, of P-type silicon shown in FIG. 1A. This slice is taken from a body of single crystal silicon and, typically, has a hole concentration of about $5 \times 10^{16}$ per cubic centimeter. One major face of the slice is usually highly polished and cleaned prior to the diffusion step which is represented as occurring between the structures shown in FIGS. 1A and 1B. Typically, a slice is subjected to phosphorus diffusion by heating at 1100 degrees centigrade for 30 minutes in an atmosphere of wet phosphorus-bearing nitrogen. This results in the formation of an N-type layer about .04 mil thick over the surface of the slice. By lapping and cleaning techniques, the slice is reduced to one having a single N-type layer 12 and a P-type region 11. Typically, these layers may have a thickness of about .04 mil for what is to serve as the N-type base region and 4 mils for the portion to be made into the P-type collector region.

The slice next is cleaned, specifically, to remove the oxide film on the surface of the silicon and then is placed in a vacuum evaporation apparatus. A perforated mask is positioned close to the N-type surface of the slice, and metallic stripes of prescribed geometry 13 are deposited from a filament source through the perforation of the mask and onto the surface of the slice, as shown in FIG. 1C. Typically, the evaporated metal is gold containing a very small percentage, one or less, of antimony to insure the low resistance characteristics of the contact to the N-type base region. These stripes, typically, may have dimensions of one mil in width and from two to six mils in length. Formation of this type of ohmic contact is disclosed in the Dacey-Lee-Shockley application referred to hereinbefore. Low resistance contacts of this type to form shallow alloyed regions are disclosed in the application of J. E. Iwersen and J. T. Nelson, Serial No. 712,-804, filed February 3, 1958, now Patent 3,028,663, issued April 10, 1962.

Following this evaporation step, the mask is moved so as to expose new areas in close relation to the gold-antimony stripes 13. Typically, the spacing between the low resistance contacts and the emitter electrodes is one mil. Advantageously, their lateral dimensions are equal. A second evaporation step then is carried out in which aluminum and boron oxide are evaporated so as to deposit both constituents through the perforation in the mask and onto the surface of the slice.

This evaporation procedure is carried out in standard apparatus well known in the art using relatively standard techniques. The aluminum source is wire of predetermined length or weight wrapped on a tungsten filament, conveniently in the form of a loop. The boron oxide ($B_2O_3$) is evaporated from a tungsten wire basket which is filled with a prescribed amount of the oxide in powdered form. Generally, the quantities of material deposited are specified in terms of the thicknesses of the films produced. Preferred thicknesses are about 10,000 angstroms for the aluminum and about 4,000 angstroms for the boron oxide. The ratio, which is volumetric, advantageously should be adhered to within about plus or minus ten percent when other thicknesses are used. The total thickness of the film deposited may range from a minimum of perhaps 5,000 angstroms, as determined by the quantity of aluminum necessary to produce alloying, and ranging to as high as 100,000 angstroms subject to the limitations of economy and utility. The silicon substrate may be either at room temperature or heated slightly.

More specifically, the quantities of material to be evaporated to produce the desired film thicknesses may be determined by reference to a paper by W. L. Bond, published in the Journal of the Optical Society of America, volume 44, pages 429 through 438, June 1954. Typically, for an evaporation source positioned seven centimeters from the surface of the slice, an aluminum wire seven centimeters in length provides a suitable film thickness of aluminum when evaporated to extinction. Similarly, 100 milligrams of boron oxide evaporated to extinction from a source about 12 inches from the target surface produce a suitable amount of this compound in a composite layer of aluminum and boron oxide. Evaporation of this composite layer may be accomplished in successive steps putting down the aluminum first, followed by the boron oxide. In certain cases it may be desirable to deposit a final layer of aluminum which inhibits vaporization of the boron compound if subsequent heat treatments are of relatively extended duration. However, the preferred evaporation procedure is a simultaneous deposition of both of the elements. In this process there appears to be an advantageous intermingling of the aluminum and boron oxide which enhances the wetting action of the aluminum and results in more uniform alloyed electrodes. In this connection it appears that the aluminum as a wetting agent provides the means for precisely controlling the extent of the alloyed area. Also, the aluminum acts to reduce the boron oxide to enable the formation of sufficient boron to increase the acceptor concentration of the alloyed region. Upon completion of the evaporation process, the resulting structure is as shown in FIG. 1D in which the two deposited layers 13 and 14 are shown side by side at spaced-apart locations on the N-type surface of the silicon slice. It will be understood that the slice may have from 30 to 60 pairs of these deposited layers on a surface.

The silicon slice next is mounted on a standard type of strip heater, typically of nickel or molybdenum, advantageously enclosed in a hydrogen atmosphere and heated for approximately one minute at about 700 degrees centigrade. Typically, the time required to reach the 700 degree level is about one minute or less. This is followed by an abrupt heating to about 1000 degrees centigrade, followed then by a similar abrupt cooling to the resolidification or eutectic temperature. The duration of the heat spike, as mentioned hereinbefore, is about ten seconds. The time required to cool the assembly to room temperature is not significant to the invention but may require a minute or more.

Referring to the graph of FIG. 2, the heat cycle is shown as consisting of a rise to a plateau at about 700 degrees centigrade followed by a spike to about 1000 degrees centigrade. These temperatures are those at the strip heater surface as predetermined by calibration. The temperatures at the alloying surfaces may be a few degrees lower. The plateau portion of the cycle may have a time duration of from 30 to 60 seconds. The lower time limit appears important for optimum results whereas the upper limit is noted for the reason that a longer duration appears unnecessary for optimum results and may cause undesirable diffusion. The temperature during this plateau portion of the heat cycle should be in the range from about 670 degrees to 790 degrees centigrade. As pointed out previously, the heat spike portion of the cycle advantageously has a duration of about ten seconds measured from the point of rise from the plateau until the aluminum-silicon eutectic at 576 degrees centigrade is reached on the cooling portion of the curve. The time duration of this spike appears significant to the process. Spikes of shorter duration are limited by the capabilities of the heater and longer duration spikes, in excess of about 15–20 seconds, do not produce as advantageous results. The peak temperature may range from about 950 degrees centigrade to 1050 degrees centigrade without materially affecting the result.

The effect of this step is to produce the arrangement shown in FIG. 1E in which each of the deposited metallic films has alloyed into the N-type silicon. The gold-antimony regions 21 form ohmic electrodes to the N-type base region 12 while the aluminum-boron oxide regions 22, on the other hand, form P-type regions which have relatively high acceptor concentrations approximately equal to or greater than $10^{19}$ per cubic centimeter. The depth of alloying of the composite aluminum-boron oxide film is comparable to the initial thickness of the aluminum layer. In other words, if the aluminum has a thickness of 10,000 angstroms, the depth of the alloyed region is of the same order of magnitude.

Next, the slice is separated into a plurality of individual mesa-type transistor elements 20 in which the P-type region 22 forms the emitter, the N-type region 12 is the base having an ohmic electrode 21, and the P-type region 11 is the collector. The bottom face of the collector region 11 customarily is plated prior to the separation of the slice into individual elements and this plating provides ohmic contact to the collector region.

The disclosed method enables the realization of P-type alloyed regions on N-type silicon which have sufficiently high acceptor concentrations for use as efficient emitters and having rather precise geometry. In particular, alloyed regions of rather minute dimensions capable of achieving the tunnel characteristic are relaizable. Boron oxide is particularly suitable for the method described herein because of its physical properties. It melts at about 450 degrees centigrade and evaporates in the range from 1200 degrees centrigrade to 1500 degrees centigrade and has a vapor pressure approximately equal to that of aluminum, thereby being uniquely suited for vacuum deposition in conjunction with aluminum. Furthermore, as mentioned previously, it appears that a desirable reduction of the boron oxide occurs in the presence of aluminum.

Although the invention has been described in terms of a single embodiment, it will be understood that other arrangements may be devised by those skilled in the art which will be within the scope and spirit of the invention.

What is claimed is:

1. In the method of fabricating a PNP diffused base silicon transistor the steps of diffusing a donor impurity into a P-type silicon body thereby to produce an N-type layer, depositing on a limited portion of said N-type layer a metallic film for providing ohmic connection to said N-type layer, depositing on another limited portion of said N-type surface a film of aluminum and boron oxide and heating said body at a temperature between 670 and 790 degrees centigrade for a period of at least 30 seconds, then raising the temperature of said body in about 5 seconds to between 950 degrees centigrade and 1050 degrees centigrade and cooling said body in about 5 seconds to below the aluminum-silicon eutectic temperature, thereby to alloy said evaporated layers to the silicon.

2. The method of fabricating a P-type conductivity region in N-type silicon semiconductor material comprising evaporating a layer of aluminum and a layer of boron oxide on a body of N-type silicon, heating said body at a temperature in the range between 670 degrees centigrade and 790 degrees centigrade for a period of at least 30 seconds, then raising the temperature of said body in about 5 seconds to between 950 degrees centigrade and 1050 degrees centigrade and cooling said body in about 5 seconds to below the aluminum-silicon eutectic temperature, thereby to alloy said evaporated layers to the silicon.

3. The method in accordance with claim 2 in which the ratio of the amount of aluminum evaporated to the amount of boron oxide evaporated is about ten to four by volume.

References Cited in the file of this patent

UNITED STATES PATENTS

| | | |
|---|---|---|
| 2,823,149 | Robinson | Feb. 11, 1958 |
| 2,829,999 | Gudmundsen | Apr. 8, 1958 |
| 2,861,018 | Fuller et al. | Nov. 18, 1958 |
| 2,956,913 | Mack et al. | Oct. 18, 1960 |
| 2,986,481 | Gudmundsen | May 30, 1961 |